United States Patent [19]
White, Jr. et al.

[11] Patent Number: 6,130,102
[45] Date of Patent: Oct. 10, 2000

[54] METHOD FOR FORMING SEMICONDUCTOR DEVICE INCLUDING A DUAL INLAID STRUCTURE

[75] Inventors: Bruce E. White, Jr., Round Rock; Robert Edwin Jones, Jr., Austin, both of Tex.

[73] Assignee: Motorola Inc., Schaumburg, Ill.

[21] Appl. No.: 08/963,443

[22] Filed: Nov. 3, 1997

[51] Int. Cl.[7] .......................... H01G 7/06; H01L 21/8242
[52] U.S. Cl. ............................... 438/3; 438/240; 438/253
[58] Field of Search ...................... 438/3, 240, 253–256, 438/393–398; 257/295

[56] References Cited

U.S. PATENT DOCUMENTS

| | | |
|---|---|---|
| 5,407,855 | 4/1995 | Maniar et al. . |
| 5,510,651 | 4/1996 | Maniar et al. ........................... 257/751 |
| 5,665,628 | 9/1997 | Summerfelt .................................. 438/3 |
| 5,668,041 | 9/1997 | Okudalara et al. ...................... 438/240 |
| 5,854,104 | 12/1998 | Onishi et al. ............................ 438/240 |
| 5,990,507 | 11/1999 | Mochizuki et al. ..................... 257/295 |

OTHER PUBLICATIONS

Kohyama, et al. "A Fully Printable, Self–aligned and Planarized Stacked Capacitor DRAM Cell Technology for 1 Gbit DRAM and Beyond", 1997 Symposium on VLSI Technology Digest of Technical Papers, pp. 17–18.

Kim, et al. "Highly Manufacturable 1 Gb SDRAM", 1997 Symposium on VLSI Technology Digest of Technical Papers, pp. 9–10.

*Primary Examiner*—Jey Tsai
*Attorney, Agent, or Firm*—J. Gustav Larson

[57] ABSTRACT

A method for forming an improved embedded DRAM structure, that is formed on-chip with CMOS logic portions, begins by forming dual inlaid regions (34a through 34c). The region (34a) is a portion of a dual inlaid region which is filled with an oxidation tolerant material (e.g., iridium or ruthenium) to form a metallic plug (36a). This plug (36a) forms a storage node region for a DRAM and electrically contacts to a current electrode (26) of a DRAM pass transistor. Opening (34b) is filled concurrently with the filling of opening (34a), to form a metallic plug (36b) which forms a bit line contact for the DRAM cell. A top portion of the dual inlaid structure (34c) is filled concurrent with regions (34a and 34b) to enable formation of a bottom electrode of the ferroelectric DRAM capacitor. Since the geometry of the region (36c) is defined by dual inlaid/CMP processing, no RIE-defined sidewall of the bottom capacitor electrode is present whereby capacitor leakage current is reduced. Furthermore, the oxygen-tolerant material used to form the plugs (36a through 36c) herein prevents adverse plug oxidation which is present in the prior art during ferroelectric oxygen annealing.

32 Claims, 6 Drawing Sheets

METHOD FOR FORMING SEMICONDUCTOR DEVICE INCLUDING A DUAL INLAID STRUCTURE

FIELD OF THE INVENTION

The present invention relates generally to semiconductor manufacturing, and more particularly to, forming oxygen-tollerant inlaid plugs for use in memory.

BACKGROUND OF THE INVENTION

The integrated circuit (IC) industry is attempting to create integrated circuits (ICs) having embedded DRAM on-chip with metal-oxide-semiconductor (MOS) logic circuitry. However, conventional CMOS logic processing, which uses tungsten (W) and/or polysilicon conductive plugs, is not readily integratable with ferroelectric embedded DRAM processing. Specifically, ferroelectric materials require an oxygen anneal process and/or an oxygen environment deposition process in order to improve the dielectric properties of the ferroelectric capacitor. This deposition or anneal process can adversely oxidize underlying/exposed tungsten and polysilicon plugs which are formed as contacts to MOS DRAM and logic transistors. Due to this oxidation problem, additional processing steps and structures are added to the process flow in an attempt to avoid this adverse plug oxidation.

Furthermore, lower capacitor electrodes of embedded DRAM capacitors are typically reactive ion etched (RIE) resulting in the formation of reactive ion-etched bottom capacitor electrode sidewalls. The reactive ion etch (RIE) of this bottom capacitor electrode roughens the surface of these sidewalls, thereby creating unwanted leakage current in the capacitor device between these sidewalls and an overlying capacitor electrode. A need exists in the IC industry to reduce or eliminate both the plug oxidation problem and the sidewall leakage current problem associated with embedded ferroelectric DRAM technology.

Specifically, the two problems discussed above (i.e., plug oxidation and sidewall capacitor current leakage) are graphically illustrated in the prior art FIG. 1. FIG. 1 illustrates tungsten plugs or polysilicon plug regions 214 as illustrated in FIG. 1. These plugs are formed to a minimum lithographic dimension W1 (roughly 0.25 microns by current standards). However, any exposed portions of the tungsten (W) or polysilicon plug 214 will be readily oxidized in an oxidation environment. In an attempt to prevent plug oxidation, an oxidation barrier layer 215 is formed overlying the contact plug 214

As illustrates that the barrier layer 215 surrounds a periphery of the contact plug by dimension W2. The ferroelectric layer 218 is annealed, or oxygen-environment deposited, to improve the dielectric properties of the ferroelectric material. The oxygen atoms in this temperature-elevated environment may diffuse through the ferroelectric layer 218 and may traverse the distance W2 in layers 215/212 to oxidize the plug 214. As the lithographic feature size W1 and cell size of the DRAM cell of FIG. 1 continues to shrink over time, this dimension W2 will also reduce in size. In addition, the distance W2 can be reduced by lithographic misalignment which is present in all lithographic processing. If the dimension W2, through lithographic misalignment or through cell shrinkage, becomes less than a threshold value, oxygen will be able to readily diffuse through the distance W2 and begin to oxidize upper corners of the tungsten (W) or polysilicon plug 214. This oxidation adversely effects contact resistance of the plug 214 and also adds parasitic interfacial capacitance to the DRAM storage node which compromises the operation of the DRAM cell.

A top capacitor electrode 220 is then formed, after oxygen annealing of layer 218, and lithographically patterned and etched along with the capacitor dielectric 218 as illustrated in FIG. 1. Note that FIG. 1 illustrates a bottom electrode sidewall 219. This sidewall 219 has been created by reactive ion etching (RIE) of the lower capacitor electrode whereby this sidewall 219 has been roughened by the reactive ion etch (RIE) process. Due to the presence of this rough sidewall surface 219 in the capacitor structure, unwanted leakage current will occur between the sidewall 219 and the upper electrode 220. It would be advantageous to reduce or eliminate this sidewall leakage current effect.

Therefore, a need exists in the industry for an embedded DRAM capacitor cell which: (1) prevents the formation of parasitic interfacial capacitance and prevents increased plug contact resistance by avoiding or reducing unwanted plug oxidation; and (2) reduces sidewall leakage current due to RIE etching of a bottom capacitor electrode.

Figure 1:
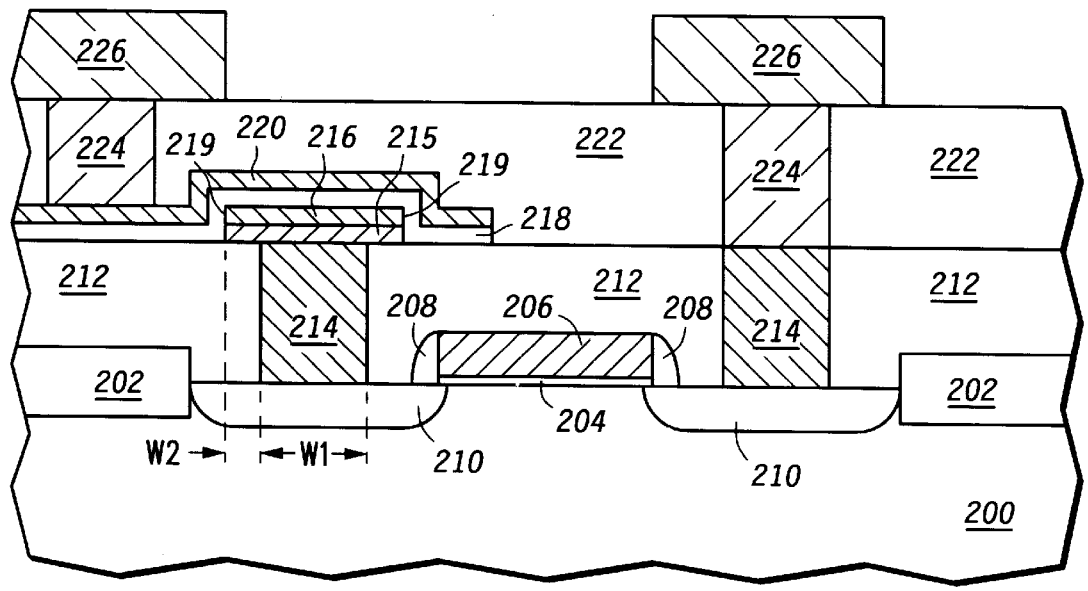
FIG. 1 illustrates, in a cross-sectional diagram, a prior art ferroelectric capacitor device wherein a conductive plug may adversely oxidize and a bottom capacitor sidewall creates unwanted electrode-to-electrode capacitor leakage current.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is a new process for forming a lower ferroelectric DRAM capacitor electrode and a metallic conductive plug region (i.e., a storage node of a DRAM cell) which improves upon the prior art. Specifically, an oxygen-tolerant metal (which either does not oxidize or forms a conductive oxide when exposed to an oxidation ambient) is used as the plug material and bottom electrode whereby adverse prior art oxidation of the contact plug is avoided. Since adverse oxidation of the contact plug is avoided, unlike the prior art, formation of parasitic interfacial capacitance is reduced in the embodiments taught herein while degradation of the conduction of the contact plug is also avoided. Specifically, dual inlaid trench formations are filled with an iridium, ruthenium, or like oxygen-tolerant metal, such that an improved DRAM structure is formed which will not adversely undergo plug oxidation in spite of lithographic misalignment and cell shrinkage. Furthermore, the dual inlaid chemical mechanical polishing (CMP) process is used herein to configure a geometric shape of a bottom DRAM capacitor electrode. This type of non-RIE electrode formation avoids the formation of reactive ion etched (RIE) sidewalls whereby sidewall leakage current between a lower electrode and an upper electrode of a ferroelectric DRAM capacitor is significantly reduced or entirely eliminated. Furthermore, the process taught herein is readily integratable with other MOS processing whereby the ferroelectric DRAM cells taught herein can be integrated on chip with microprocessor components whereby an embedded DRAM microcontroller can be formed.

Figure 5:
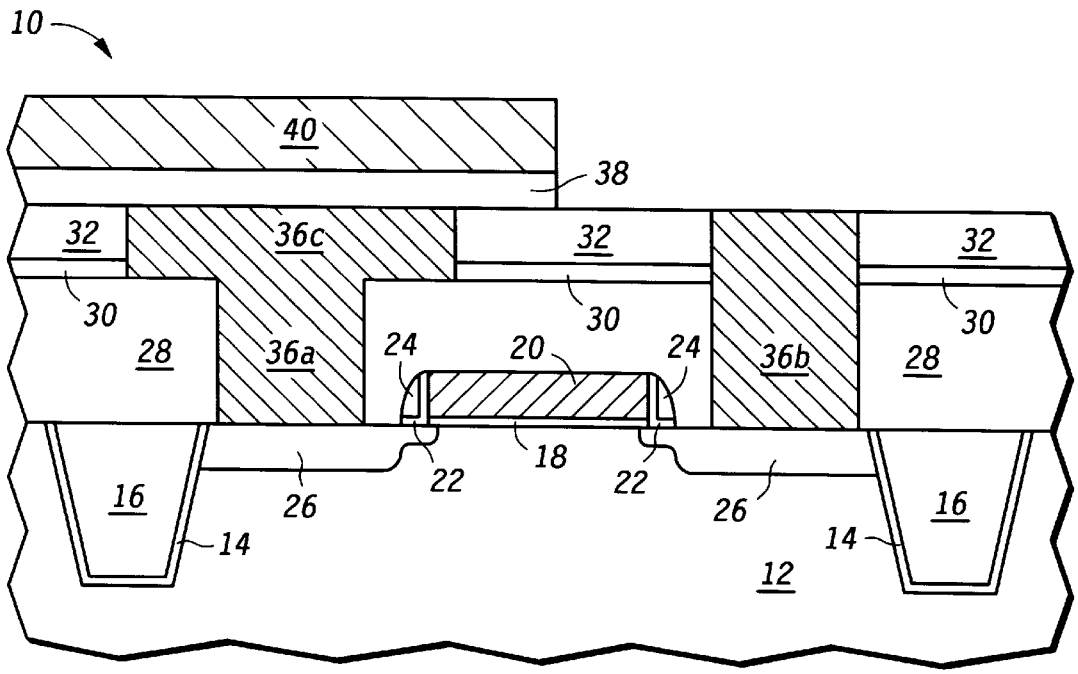
Figure 6:
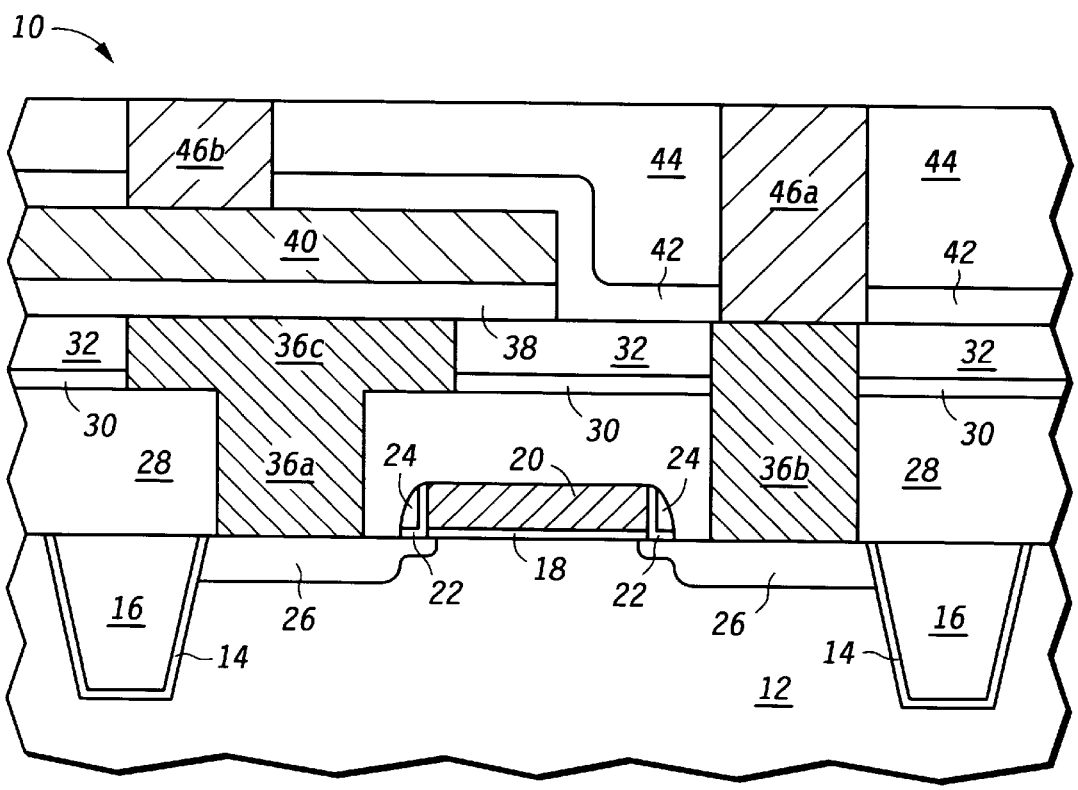
Figure 7:
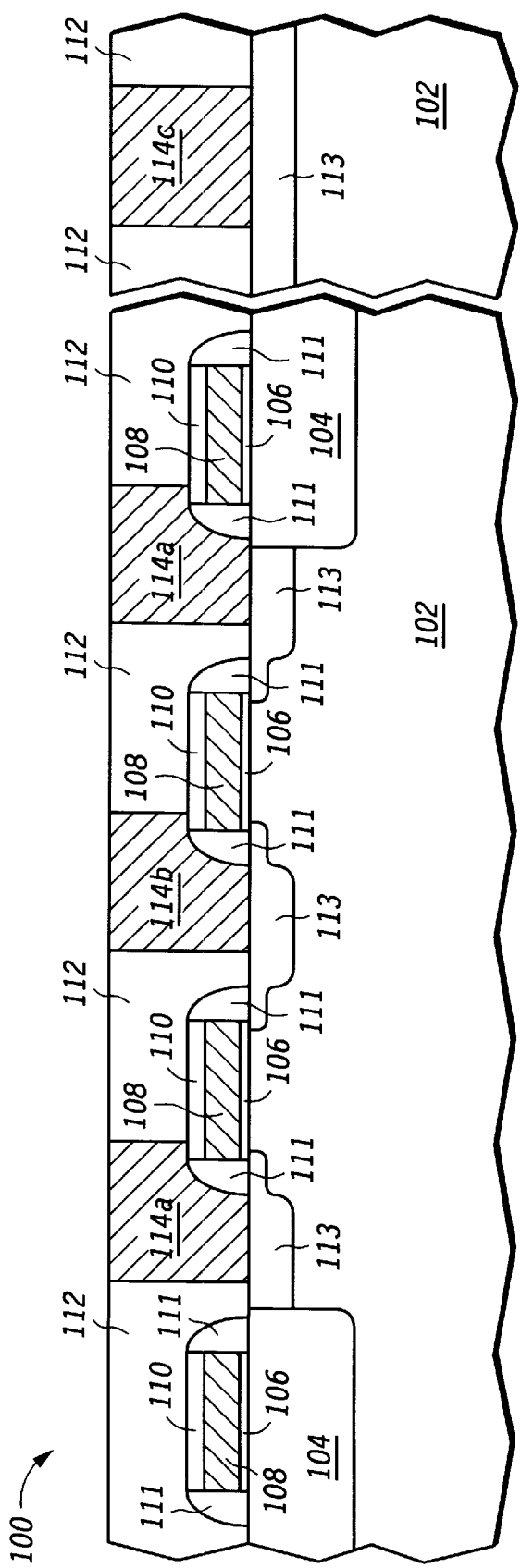
FIGS. 7–8 illustrate, in cross-sectional diagrams, another process for forming an improved embedded DRAM structure in accordance with the present invention.
Figure 8:
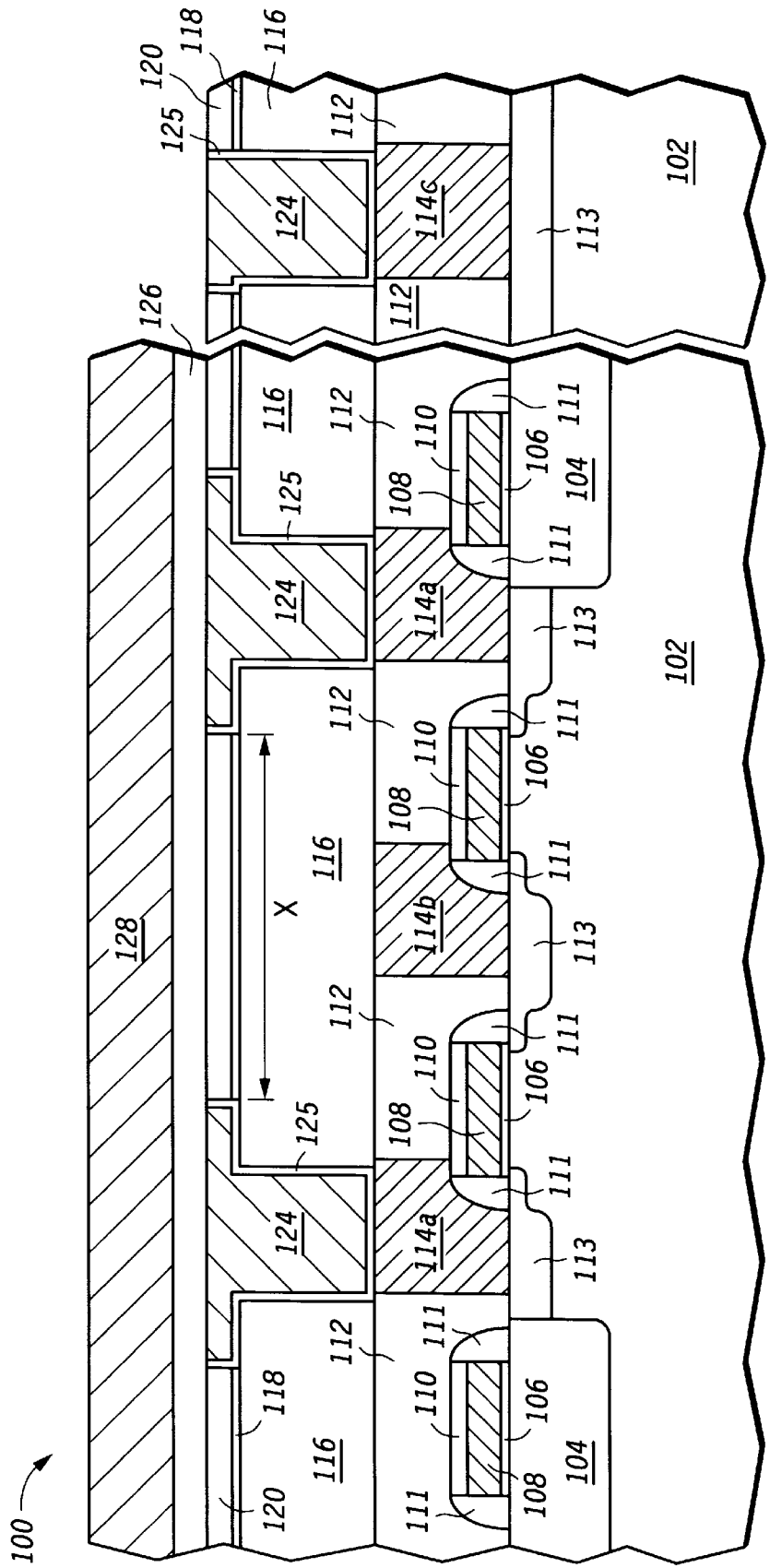

The invention can be further understood with reference to FIGS. 2–8. FIGS. 2–6 illustrate a first embodiment, FIGS. 7–8 illustrate yet another embodiment, and FIGS. 9 and 10 each illustrate an alternate DRAM storage node and bottom capacitor electrode structure which may be used in the embodiments of FIGS. 2–8.

Figure 2:
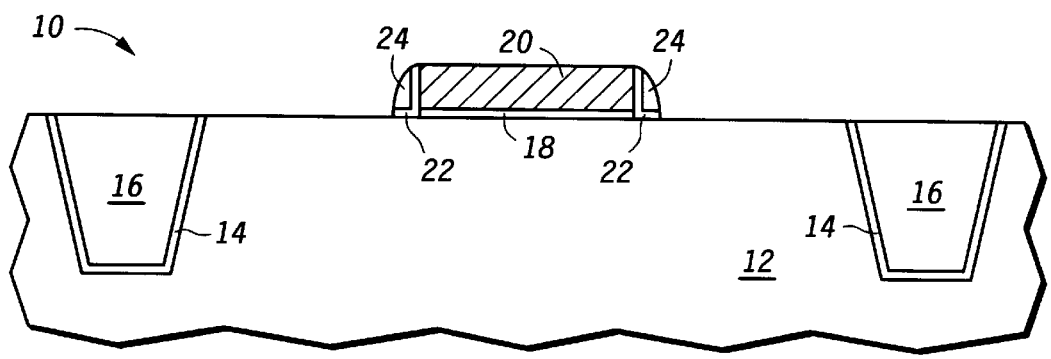
FIGS. 2–6 illustrate, in cross-sectional diagrams, a process for forming an improved embedded DRAM structure in accordance with the present invention.

FIGS. 2–6 illustrate a first embodiment of the present invention. FIG. 2 illustrates a semiconductor structure 10. Semiconductor structure 10 contains a substrate 12. The substrate 12 is preferably a silicon substrate/wafer, but may be a gallium arsenide substrate, a germanium silicon substrate, a germanium substrate, an epitaxial formation, silicon carbide, a silicon-on-insulator (SOI) substrate, or like substrate materials.

FIG. 2 illustrates that a lithographic patterning and etch step is performed whereby trench regions are formed in the substrate 12. The trench regions are then lined with a thermally grown oxide 14 which may also be an oxynitride liner layer. These trench regions are then filled with a dielectric trench fill material 16 which is preferably an oxide formed by reacting tetraethylorthosilicate (TEOS). Other materials may be used to form the effective shallow trench isolation (STI) structures in FIG. 2. In addition, other isolation schemes, such as location oxidation of silicon (LOCOS), polysilicon buffered LOCOS (PBL), or the like, may be used in lieu of trench isolation in FIG. 2.

A gate dielectric layer 18 is then formed overlying an active area of the substrate 12. One or more of sacrificial gate oxide processing and/or RCA cleaning may be performed before final gate oxide formation of layer 18. A gate electrode layer 20 is then formed overlying the gate dielectric 18. It is important to note that the gate oxide 18 may be a thermally grown oxide or a composite of deposited dielectric(s) and thermally grown dielectric(s). Preferably, the gate electrode layer 20 is one or more layers of polysilicon or amorphous silicon, but may be a metallic material or a polysilicon material which is optionally silicided with a refractory metal. The gate electrode 20 can be optionally capped with a silicon nitride layer, an anti-reflective coating (ARC) layer, or etch stop layer which enables self-aligned source and drain contacts. A photolithography patterning and etch step is then utilized to define a geometry of the gate electrode 20 as illustrated in FIG. 2.

A sidewall oxidation process is then utilized to form a thin oxide layer 22 as illustrated in FIG. 2. Silicon nitride spacers 24 are then formed overlying the oxide layer 22. The silicon nitride spacers may be used to forming doped drain regions (LDD regions) within the substrate 12 of FIG. 2 and may be used to enable self-aligned selectively-etched subsequent source and drain electrical contacts.

Figure 3:
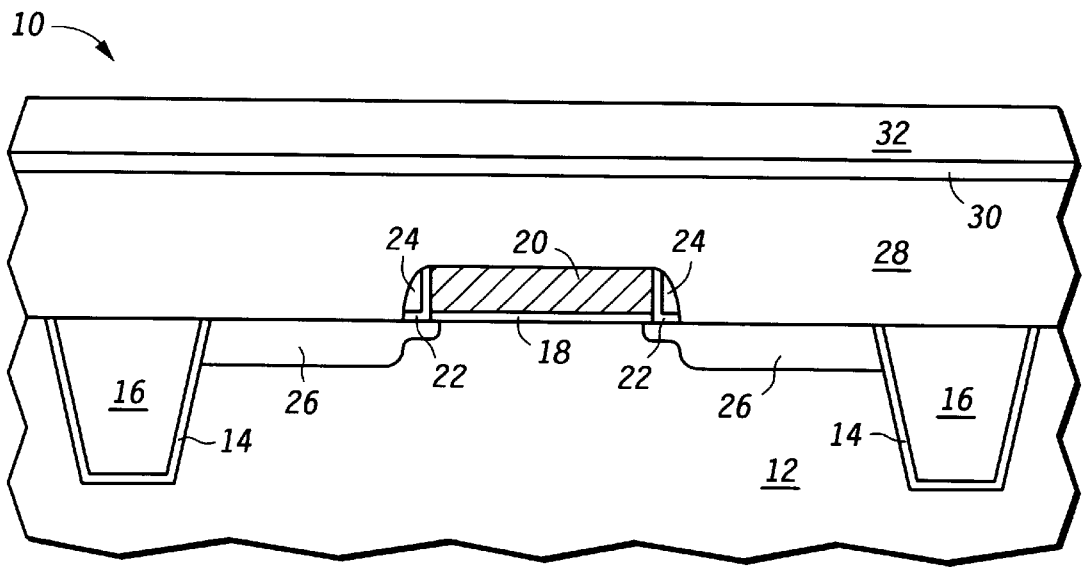

FIG. 3 illustrates the formation of the lightly doped drain (LDD) regions 26 within the substrate 12. An ILD region 28 is formed after formation of the gate electrode region 20 and the LDD source and drain regions 26. Preferably, the ILD region 28 is formed using tetraethylorthosilicate (TEOS). In other embodiments, the region 28 may comprise a composite of ozone TEOS and furnace TEOS or may comprise other layers such as borophosphosilicate glass (BPSG), phosphosilicate glass (PSG), and/or like dielectric materials. Layer 28 is chemically mechanically polished (CMP) before formation of the layer 30 to form a top planar surface of the layer 28.

After planarization of the layer 28, an etch stop layer 30 is formed over the top of the polished layer 28. Preferably, the layer 30 is a layer of silicon nitride. A second dielectric layer 32 is then formed over a top of the etch stop layer 30. Preferably, layer 32 is similar to layer 28 in material composition so that layer 32 is also preferably of a TEOS composition. Layer 32 will subsequently determine a thickness of a bottom capacitor electrode for the ferroelectric DRAM capacitor and the layer 32 is therefore formed having a thickness between a few hundred angstroms to 2,000 angstroms which are typical ranges for the final device thickness of the bottom capacitor electrode.

Figure 4:
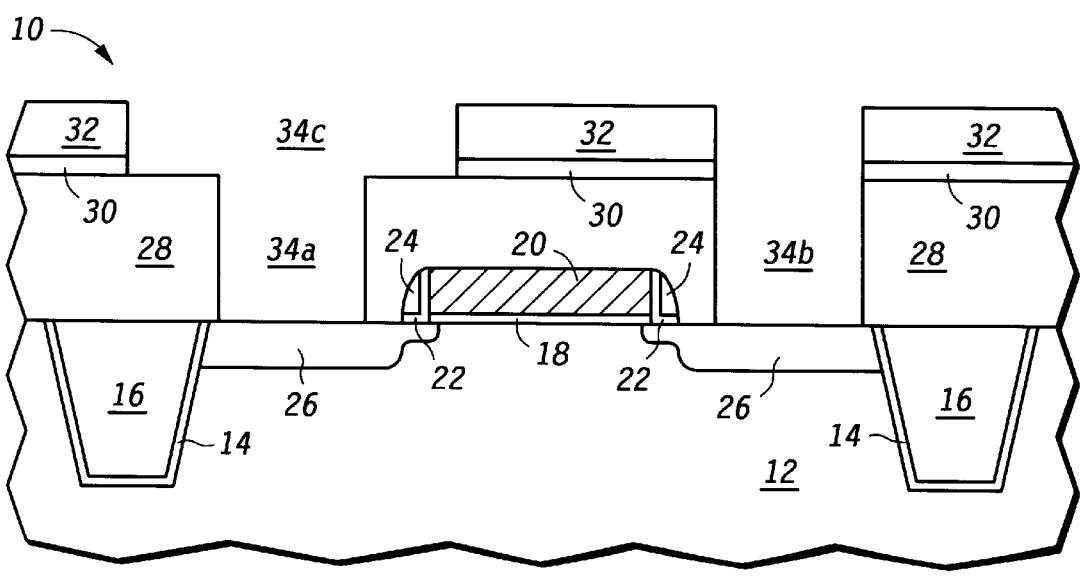

FIG. 4 illustrates that the layers 28, 30, and 32 are used to form dual inlaid trench structures within the structure 10. Specifically, FIG. 4 illustrates that three dual inlaid trench regions are formed within the structure 10. A first trench region 34*a*, which is part of a dual inlaid structure, will be a contact portion which makes electrical contact to the source/drain region 26. A second region 34*c* will contain conductive material which will function as a bottom capacitor electrode which is coupled to the contact portion 34*a*. A third region 34*b* in FIG. 4 will be a DRAM bit line contact to a second source/drain region 26 in a right hand portion of FIG. 4.

The actual dual inlaid openings 34*a*–34*c* of FIG. 4 can be formed in one of many different manners. In a first method, a first photoresist pattern may be formed which enables the formation of the openings 34*a* and 34*b* through the uppermost layers 32 and 30 in FIG. 4. This first photoresist layer is then stripped away and a second photoresist layer is deposited, and patterned. This second photoresist layers allow the etching of 34*c* and the simultaneous deepening of openings 34*a* and 34*b* through the layer 28. In a second method, a first photoresist layer may be utilized to form the openings 34*a* and 34*b* entirely through all of the layers 28, 30, and 32 to expose or nearly expose the source/drain regions 26. After the openings 34*a* and 34*b* are substantially formed through layer 28, the first photoresist layer is removed and a second photoresist layer is formed. This second photoresist mask allows etch processing to create the opening 34*c* above the existing opening 34*a*, as well as 34*b* in FIG. 4. In yet a third method, the opening 34*c* can be formed first within the layer 32 using a first photolithographic mask. After the formation of 34*c*, a second lithographic mask is then formed to enable creation of the openings 34*a* and 34*b* in FIG. 4 through layer 28.

The source and drain regions 26 may be optionally silicided to create an etch stop which is used during processing of the openings 34*a* and 34*b*. These optional silicide layers will also improve (decrease) the resistivity of the source and drain regions 26. Furthermore, the etching of the openings 34*a* and 34*b* may be aided by an etch stop layer (not illustrated in FIG. 4) which is positioned between the layer 28 and the substrate 12. This etch stop layer could be silicon nitride formed on a thin pad oxide.

FIG. 5 illustrates that an oxygen-tolerant material, such as iridium or ruthenium, is blanket deposited to fill the openings 34a through 34c in FIG. 4. In FIG. 5, this oxygen-tolerant material is chemically mechanically polished (CMP) or etched back to form metallic plug regions 36a through 36c in FIG. 5.

The region 36a is a metallic plug region which functions as a contact portion and/or a DRAM storage node portion whereby the plug 36a makes electrical contact to the source drain region 26. The upper dual inlaid portion 36c of FIG. 5 forms a lower capacitor electrode for a ferroelectric DRAM capacitor. The plug region 36b forms a bit line connection to the other source/drain region 26 in FIG. 5. The gate electrode 20 of FIG. 5 will function as a pass gate electrode structure for the DRAM storage device. One material for the formation of regions 36a through 36c is iridium. However, any oxygen-tolerant material which either does not oxidize or forms a conductive oxide in an oxidizing ambient can be used in FIG. 5 to form the regions 36a–36c. In addition, the material used to form regions 36a through 36c may be a material such as an oxygen barrier. This oxygen barrier property of the regions 36a–36c protects layers which underlie the areas 36a through 36c from being adversely oxidized as discussed with reference to FIG. 1 herein while the layers 36a–36c are themselves not adversely impacted by oxidation. In other words, the layers 36a through 36c are preferably formed from oxygen-tolerant metal which remains conductive when oxidized to form a conductive region, or an oxygen-tolerant metal which does not readily oxidize.

In FIG. 5, ferroelectric material 38 is then deposited overlying the capacitor electrode region 36c. The ferroelectric (high K or high permitivity dielectric) layer 38 is preferably made, at least in part, by barium strontium titanate (BST). Any other ferroelectric material may also be utilized for region 38 such as lead zirconium titanate (PZT), strontium bismuth tantalate (SBT), composites thereof, or the like. The ferroelectric material is one or more of: (1) deposited in an oxygen environment; (2) oxygen annealed after deposition; or (3) exposed to an oxygen etch or ash process which will improve the ferroelectric properties of the layer 38. However, it is these anneal steps that result in process integration problems in the prior art (see FIG. 1 herein and corresponding textual discussion). A top electrode layer of material 40 is then deposited over the layer 38. Preferably, the layer 40 is also made of iridium. However, the layer 40 may be made of platinum, iridium, ruthenium, palladium, osmium, rhenium, composites thereof, or the like.

FIG. 5 illustrates that a photoresist and etch process is used to pattern a top electrode 40 in a self-aligned manner with the underlying ferroelectric layer 38. The resulting layers 36c, 38, and 40 form a ferroelectric capacitor for the ferroelectric DRAM cell which is coupled via the contact region 36a to the DRAM pass transistor that is gated by gate electrode 20.

FIG. 6 illustrates that the top capacitor electrode 40 and the ferroelectric material 38 are encapsulated with a first interlevel dielectric (ILD) layer 42. Preferably, the layer 42 is an ozone TEOS layer, or plasma enhanced chemical vapor deposited TEOS, or a like dielectric material. The layer 42 is then encapsulated with a second dielectric layer 44 which is preferably another ozone TEOS layer or a furnace TEOS layer. A lithographic patterning and etch process is then used to form openings 46a and 46b through the layers 42 and 44. The openings 46a and 46b are then plugged with conductive materials such as tungsten (W), aluminum (Al), copper (Cu), or like materials. The metallic plug regions taught herein may be optionally lined with adhesion layers such as titanium-tungsten (Ti/W), titanium nitride (TiN), tungsten (W), tantalum nitride (e.g., TaNx), composites thereof, and/or the like. The plug regions 46a and 46b are also formed via chemical mechanical polishing (CMP) as is discussed herein.

As previously discussed, the layer 38 of FIG. 6 is oxygen annealed in order to improve the ferroelectric dielectric properties of layer 38. This anneal process will not adversely effect the layer 36c since layer 36c is formed of an oxygen-tolerant metal which either forms a conductive oxide when exposed to an oxygen environment or does not oxidize at all in an oxidizing environment. Furthermore, in one embodiment, the layer 36c is preferably an oxygenation barrier which prevents layers underlying region 36c from oxidizing. Therefore, the layer 36c can be used to protect underlying silicide or tungsten layers which may be conventionally formed due to the presence of on-chip MOS logic arrays and subjected to damage by oxidation. The structure of FIG. 6 eliminates the problem illustrated via the dimension W2 in FIG. 1 whereby barrier layers, whose effectiveness are a function of lithographic misalignment and cell shrinkage, are not needed in the improved structure of FIG. 6. Furthermore, the lower DRAM capacitor electrode 36c is physically defined via chemical mechanical polishing (CMP) and therefore bottom electrode 36c does not contain any reactive ion etched (RIE) sidewalls 219 as are present in FIG. 1. Therefore, unwanted parasitic RIE-induced sidewall leakage current occurring between the layer 36c and the electrode 40 in FIG. 6 is reduced over that of the prior art illustrated in FIG. 1.

The embodiment of FIGS. 2–6 create oxidation tolerant plugs (e.g., iridium plugs) whereby the iridium (Ir) plugs form: (1) bit line contacts 36b for the embedded DRAM cell; (2) bottom capacitor electrodes 36c for the DRAM capacitor; (3) storage node contact regions 36a; and (4) iridium MOS logic plug regions which contact to MOS logic arrays off of the page of FIG. 6.

FIGS. 7–8 illustrate an alternate embodiment to FIGS. 2–6 whereby tungsten (W) plugs, which are conventional to MOS logic processing, may still be utilized in an MOS array and utilized in an embedded CMOS structure while still avoiding the sidewall leakage current and adverse oxidation processing discussed with respect to FIG. 1 herein. FIG. 7 illustrates a second embodiment structure 100. A substrate 102 analogous to a substrate 12 is provided in FIG. 7. Trench isolation 104, analogous to trench isolation 14 and 16 in FIG. 6, is formed in FIG. 7. Sacrificial gate oxide processing, substrate cleaning, and formation of gate oxide 106 is performed in a manner similar to gate dielectric 18 of FIG. 6. Polysilicon and/or metallic gate electrodes 108 are formed in manner similar to gate electrode 20 of FIG. 6. The layer 108 in FIG. 7 is used to: (1) form and route word lines for the DRAM arrays of FIG. 7; and (2) form logic gate electrodes in a logic array of the integrated circuit (IC) (not specifically illustrated in FIG. 7). A silicon nitride layer 110 is formed over a top portion of the layer 108 to enable self-aligned contact formation without the worry of electrical short-circuiting to the gate electrodes and word lines 108. A silicon nitride sidewall spacer 111 is also formed in FIG. 7 to further allow for subsequent self-aligned contact formation.

An interlevel dielectric (ILD) 112, similar to the ILD 28, is formed in FIG. 7. This interlevel dielectric layer 112 is also polished as previously discussed for layer 28. A lithographic process in conjunction with an etch process is used to pattern and define openings 114a and 114b in FIG. 7. Openings 114a are minimum lithographic feature sized contacts which are used to subsequently form metallic storage node regions for individual DRAM capacitor cells. The openings 114b form embedded low-level metallic bit line structures which come vertically out-of-the-page of FIG. 7 and then laterally connect (i.e., parallel to the paper plane of FIG. 7 and perpendicular to the word lines 108) between other DRAM devices which are positioned in columns running perpendicular to the word lines 108. Therefore, FIG. 7 illustrates a structure wherein the layer 114b forms an embedded tungsten (W) bit line structure using technology conventionally used for plug contacts in MOS logic technology.

FIG. 7 illustrates that tungsten (W), copper (Cu), or like metallic composites/materials or polysilicon are deposited and then chemically mechanically polished (CMP) to form the metallic storage nodes 114a and the metallic bit lines 114b (the bit lines running between a plurality of column-configured laterally adjacent DRAM cells). These regions, 114a and 114b, are made to source and drain regions 113 which were previously formed within the substrate 102. A right-hand portion of FIG. 7 also illustrates that logic CMOS areas separated from the DRAM areas may also form tungsten (W) or polysilicon plug regions 114c simultaneous to the formation of layers 114a and 114b.

FIG. 8 then illustrates that the processing of FIGS. 3–6 is performed overlying the tungsten (W) plugs 114 of FIGS. 7–8. Specifically, FIG. 8 illustrates the formation of layers 116, 118, and 120 which are respectively analogous to dual inlaid dielectric layers 28, 30, and 32 of FIG. 6. Dual inlaid openings 124 are formed in FIG. 8 wherein these dual inlaid openings 124 are analogous to the regions 36a, 36b, and 36c of FIG. 6. It is important to note that FIG. 8 illustrates an alternate dual inlaid composite structure to that illustrated in FIG. 6. This alternate dual in-laid metallic embodiment of FIG. 8 may also be utilized in FIG. 6. FIG. 8 specifically illustrates that a first metallic layer 125 is deposited followed by a second metallic layer 124 before polishing. These metallic layers are then chemically mechanically polished (CMPed) to form a composite metal plug region comprising a first metallic material 125 and a second metallic material 124. In a preferred form, the layer of material 125 is iridium (Ir) and the material 124 is platinum (Pt). Platinum is preferred in the metallic plug, even though it may complicate processing because of additional deposition steps, since platinum renders an improved capacitor-dielectric-to-electrode interface compared to other metals.

In another form, the layer 125 may be any other metallic material or adhesion layer, such as titanium nitride (TiN), and the layer 124 may be any other metallic material, such as iridium (Ir). This composite material 124 and 125 is chemically mechanically polished (CMPed) to form MOS logic plug regions illustrated to the right in FIG. 8 and composite dual inlaid bottom capacitor electrode and storage node regions 124/125 in FIG. 8. Since the bit line 114b is surrounded by dielectric the lithographic separation X, illustrated in FIG. 8, can be minimized by cell shrinkage to achieve a smaller cell size. This shrinkage, due to the buried bit line 114b, allows for the significant reduction in DRAM cell size over the prior art cells which do not have a buried bit line structure.

FIG. 8 illustrates that a ferroelectric material 126, which is analogous to ferroelectric material 38 of FIG. 6, is formed over the metallic inlaid structures 124/125. Region 126 is removed from over the logic array illustrated in a right hand portion of FIG. 8. This removal of the ferroelectric material 126 from the logic portions is performed since no ferroelectric capacitor regions are required in the CMOS logic portions located to the right of FIG. 8. Note that the layer 126 is either oxygen annealed or deposited in an oxygen-containing environment to improve dielectric properties of the film 126. This oxygen anneal will not adversely affect the underlying oxidizable plugs 114a–114c due to the presence of the thick oxide 116 and the oxidizing barrier properties of one or more of the materials 124 and 125. Therefore, the process of FIGS. 7–8 enables the use of conventional tungsten (W) plug processing followed by oxidation protective and improved ferroelectric capacitor formation. After oxygen annealing of the layer 126, a top capacitor electrode 128 is then formed overlying the ferroelectric material 126. Layer 128 is analogous to the previously discussed layer 40 from FIG. 6. The layer 126 may be segmented to form isolated ferroelectric regions for each DRAM cell or may be continuous as illustrated in FIG. 8.

After the formation of the top electrodes 128, the material 128 is also removed or prevented from being formed in the logic array illustrated to the right of FIG. 8. This is performed since an upper electrode region is not required in the logic array of FIG. 8. After the formation of top electrode 128, conventional interconnect processing which may include dual inlaid or damascene metal interconnect processing may be performed to form structures analogous to regions 46a and 46b in FIG. 6. These regions are not specifically illustrated overlying the layer 128 in FIG. 8.

Figure 9:
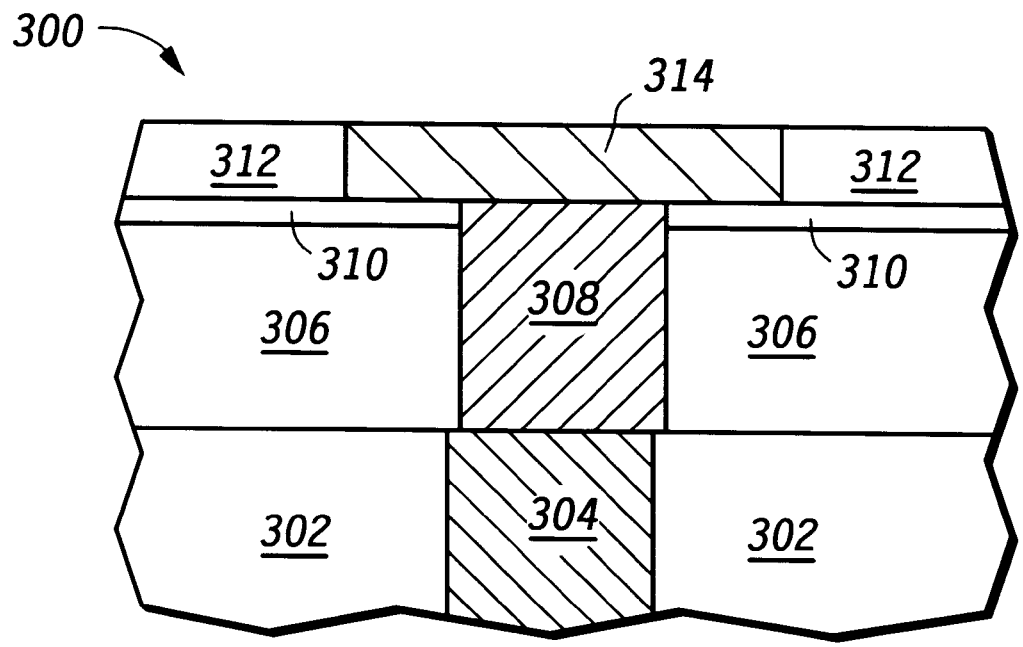
FIG. 9 illustrates, in a cross-sectional diagram, a capacitor storage node which may be formed using three single in-laid metal steps forming three different metallic plug regions of different materials in accordance with the present invention.

FIG. 9 illustrates an alternate storage node and bottom capacitor electrode structure which can replace the layers 114a, 124, and 125 in FIG. 8. FIG. 9 illustrates a dielectric layer 302 which is analogous to the dielectric layer 112 in FIG. 8. A tungsten plug 304 is then formed in a single inlaid process as illustrated in FIG. 7. After formation of the tungsten plug 304, a dielectric layer 306 and an etch stop layer 310 is deposited. Preferably, the dielectric layer 306 is a TEOS layer and the layer 310 is a silicon nitride layer. A single inlaid process utilizing photoresist and etch processing forms an opening 308 through the layers 306 and 310 in FIG. 9. This opening exposes a top portion of the tungsten plug 304. This single inlaid structure is then filled with an iridium material and chemically mechanically polished, wherein layer 310 is utilized as a polish stop. After polishing the iridium material to form an iridium plug 308, a dielectric layer 312 is deposited on top of the silicon nitride layer 310. A photoresist mask and etch process is then used to form an opening through the layer 312. This opening is formed using an etch chemistry which is selective to the silicon nitride layer 310 whereby this opening exposes a top portion of the iridium layer 308. The result is a single inlaid opening formed through the layer 312 which exposes a top portion of the iridium plug 308. This opening through layer 312 is then filled with a platinum material and chemically mechanically polished to form a platinum plug 314 in FIG. 9.

The structure of FIG. 9 is different from the structure in FIG. 8 due to the fact that each of the three plug regions 304, 308, and 314 in FIG. 9 are each formed using a single inlaid process and are not formed using dual inlaid processing as was used to form the plugs 124 and 125 in FIG. 8. FIG. 9 is improved over the storage node and capacitor electrode of FIG. 8 for some embodiments since the capacitor electrode of FIG. 9 is formed using a platinum material while the plug 308 is made of iridium and retains its oxygen barrier properties. Therefore, the structure of FIG. 9 will adequately protect the underlying tungsten plug 304 from oxidation while also providing a bottom capacitor electrode 314 which is made of platinum, wherein the capacitor dielectric to electrode interface will be improved over that which is available when using iridium.

Figure 10:
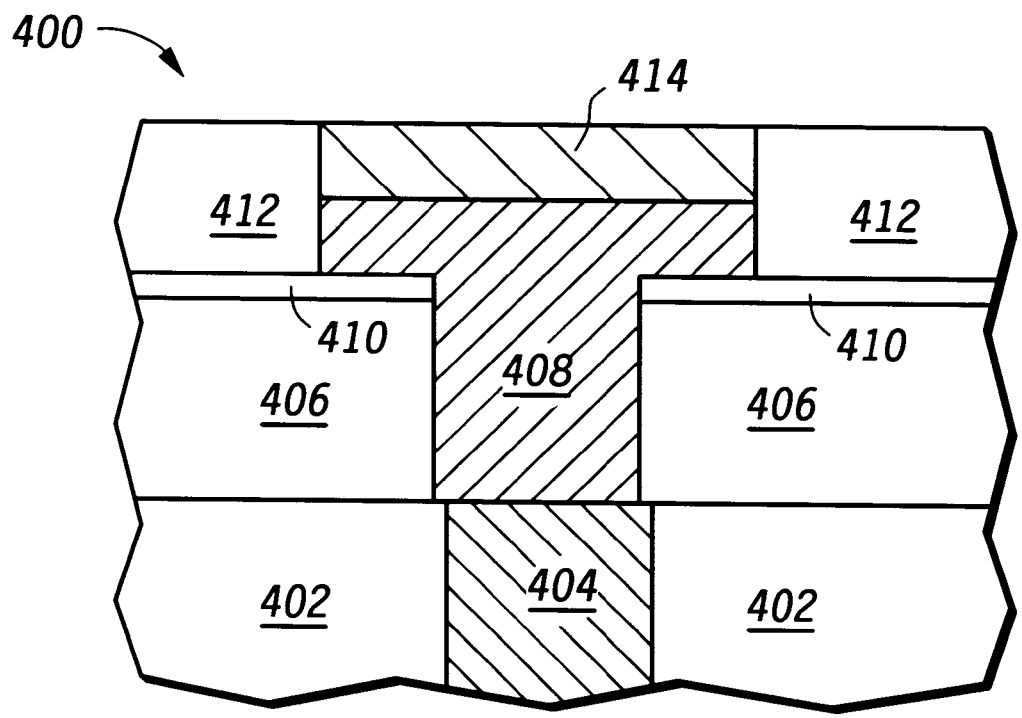
FIG. 10 illustrates, in a cross-sectional diagram, a capacitor storage node which may be formed using dual in-laid processing to form an improved capacitor-electrode-to-capacitor-dielectric interface in accordance with the present invention.

FIG. 10 illustrates yet another embodiment for replacing the layers 114A, 124, and 125 in FIG. 8 to form yet another storage node structure and bottom capacitor electrode for an embedded DRAM cell. FIG. 10 illustrates a dielectric layer 402 which is analogous to the dielectric layer 112 of FIG. 8. A tungsten plug 404 is formed in a single inlaid process as was previously discussed with respect to FIG. 7. After planarization of the tungsten material to form the tungsten plug 404, a TEOS dielectric layer 406 is deposited. This TEOS layer 406 is capped with a silicon nitride etch stop layer 410. A dielectric layer 412 is then formed overlying the etch stop layer 410 in FIG. 10. Dual inlaid processing as taught herein is then used to form a dual inlaid opening through all three of the layers of 406, 410, and 412. A ruthenium containing material 408 is then deposited and chemically mechanically polished so that the ruthenium containing material is initially coplanar with a top surface of the layer 412. The ruthenate containing material is then exposed to an oxygen plasma etch process which is relatively selective to the oxide 412. This selective etch environment will be reduce the top surface of the ruthenium containing plug 408 such that the ruthenium containing plug 408 is recessed into the dual inlaid opening through layer 412. This recess in the dual inlaid opening is then filled with a platinum material and once again chemically mechanically polished to form an upper platinum plug region 414 above the ruthenium plug 408. Therefore, the resulting structure of FIG. 10 is similar in advantages to that illustrated in FIG. 9 in that the middle ruthenium portion of the storage node stack of FIG. 10 retains the oxygen barrier properties which are advantageous as taught herein. In addition, FIG. 10 also contains the platinum upper electrode portion similar to that illustrated in FIG. 9 whereby the interface between the capacitor dielectric and the bottom capacitor electrode is improved.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, ferroelectric nonvolatile memory as well as ferroelectric DRAM devices can benefit from the present invention. In addition, the oxygen-tolerant material can include Rhenium (Re), Osmium (Os), Platinum (Pt), and Paladium (Pd). Therefore, it is intended that this invention encompass all of the variations and modifications as fall within the scope of the appended claims.

What is claimed is:

1. A method for forming a semiconductor device structure comprising the steps of:
    providing a semiconductor substrate;
    forming a dielectric region over the semiconductor substrate;
    forming a dual inlaid opening in the dielectric region, wherein:
        the dual inlaid opening having an upper region having a first width between first substantially parallel first sidewall portions of the dual inlaid opening;
        a lower region having a second width between second substantially parallel second sidewall portions of the dual inlaid opening; and
        the upper region is significantly wider than the lower region; and
    filling at least a portion of the dual inlaid opening with an oxygen-tolerant metal to form an inlaid portion having a top inlaid portion and a bottom inlaid portion.

2. The method of claim 1, further comprising the step of:
    forming a capacitor dielectric over the top inlaid portion, wherein the top inlaid portion forms a first capacitor electrode; and
    forming a second capacitor electrode over the capacitor dielectric.

3. The method of claim 2, wherein the step of filling the dual inlaid opening further comprises:
    filling the dual inlaid opening wherein the bottom inlaid portion is electrically connected to a portion of the semiconductor substrate to form a contact portion.

4. The method of claim 2, wherein the step of forming a capacitor dielectric further comprises:
    forming a capacitor dielectric wherein the capacitor dielectric is a high permitivity dielectric (high-k dielectric).

5. The method of claim 4, wherein the step of forming a capacitor dielectric further comprises:
    forming a capacitor dielectric wherein the high permitivity dielectric comprises a ferroelectric material.

6. The method of claim 4, wherein the step of forming a capacitor dielectric further comprises:
    forming a capacitor dielectric wherein the capacitor dielectric comprises a titanium oxide compound ($TiO_x$).

7. The method of claim 6, wherein the step of forming a capacitor dielectric further comprises:
    forming a capacitor dielectric wherein the capacitor dielectric is selected from the group of barium titanate and strontium titanate ($SrTiO_3$).

8. The method of claim 1, wherein the step of filling further comprises:
    filling the dual inlaid opening wherein the bottom inlaid portion is substantially in direct contact with the semiconductor substrate.

9. The method of claim 1, wherein the step of filling further comprises:
    filling the dual inlaid opening wherein the bottom inlaid portion is substantially in direct contact with a conductive plug, wherein the conductive plug is in electrically connected with the semiconductor substrate.

10. The method of claim 9, wherein the step of filling further comprises:
    filling the dual inlaid opening, wherein the conductive plug is tungsten.

11. The method of claim 1, wherein the step of filling the dual inlaid opening further comprises:
    filling the dual inlaid opening wherein the bottom inlaid portion is electrically coupled to a portion of the semiconductor substrate.

12. The method of claim 1, wherein the step of filling the dual inlaid opening further comprises:
    filling the dual inlaid opening wherein the oxygen-tolerant metal comprises iridium (Ir).

13. The method of claim 1, wherein the step of filling the dual inlaid opening further comprises:
    filling the dual inlaid opening wherein the oxygen-tolerant metal comprises ruthenium (Ru).

14. The method of claim 1, wherein the step of filling the dual inlaid opening further comprises:
    filling the dual inlaid opening wherein the oxygen-tolerant metal comprises osmium (Os).

15. The method of claim 1, wherein the step of filling the dual inlaid opening further comprises:

filling the dual inlaid opening wherein the oxygen-tolerant metal comprises Platinum (Pt).

16. The method of claim 1, wherein the step of filling the dual inlaid opening further comprises:

filling the dual inlaid opening wherein the oxygen-tolerant metal comprises Paladium (Pd).

17. The method of claim 1, wherein the step of filling the dual inlaid opening further comprises:

filling the dual inlaid opening wherein the oxygen-tolerant metal comprises rhenium (Re).

18. The method of claim 1, wherein the step of filling further comprises:

filling the dual inlaid opening to form an inlaid portion wherein the inlaid portion comprises a portion of a storage node of a memory.

19. The method of claim 1, wherein the step of filling further comprises the substeps of:

filling a first portion of the dual inlaid opening with a first conductive material; and filling a second portion of the dual inlaid opening with the oxygen-tolerant metal.

20. The method of claim 19, wherein the step of filling a first portion further comprises:

filling the first portion of the dual inlaid opening with a first conductive material that is different than the oxygen-tolerant metal.

21. The method of claim 20, wherein the step of filling a first portion further comprises:

filling the first portion of the dual inlaid opening with a first conductive material that is an oxygen intolerant material.

22. A method of forming a memory cell comprising the steps of:

providing a semiconductor substrate;

forming a transistor on the semiconductor substrate, the transistor having a first current electrode, a second current electrode, and a gate;

forming a bit line coupled to the first current electrode;

forming a word line coupled to the gate;

forming a dual inlaid opening over the second current electrode;

filling the dual inlaid opening with an oxygen-tolerant metal to form a first capacitor electrode at a top portion of the dual inlaid opening and a storage node portion at a bottom portion of the dual inlaid opening, the bottom portion being electrically coupled to the second current electrode;

forming a dielectric region over the first capacitor electrode; and forming a second capacitor electrode over the dielectric region.

23. The method of claim 22 wherein the step of filling further comprises:

filling the dual inlaid opening wherein the oxygen-tolerant metal comprises iridium (Ir).

24. The method of claim 22 wherein the step of forming a dielectric region further comprises:

forming a dielectric region wherein dielectric region comprises a high permitivity dielectric.

25. The method of claim 22, further comprising the steps of:

forming an interlevel dielectric region over the semiconductor substrate;

forming a first opening in the interlevel dielectric region over the second current electrode; and filling the first opening with a conductive material to form a bottom portion of a storage node, wherein the bottom portion of the storage node is electrically coupled to the second current electrode and is formed prior to the step of forming the dual inlaid opening.

26. The method of claim 22, wherein the step of filling further comprises:

filling the dual inlaid opening, wherein the first capacitor electrode contacts the second current electrode.

27. The method of claim 22, wherein the method of forming a memory cell includes forming a Dynamic Random Access Memory (DRAM) cell as the memory cell.

28. The method of claim 22, wherein the method of forming a memory cell includes forming a ferroelectric nonvolatile memory bit cell as the memory cell.

29. A method of forming a semiconductor structure, the method comprising the steps of:

providing a semiconductor substrate;

forming a memory cell transistor on the semiconductor substrate, the memory cell transistor having a first current electrode, a second current electrode, and a gate;

forming a logic gate transistor on the semiconductor substrate, the logic gate transistor having a first current electrode, a second current electrode, and a gate;

forming a bit line coupled to the first current electrode of the memory cell transistor;

forming a word line coupled to the gate of the memory cell transistor;

forming a dual inlaid opening over the second current electrode of the memory cell transistor;

forming an inlaid opening over the second current electrode of the logic gate transistor;

filling the dual inlaid opening and the inlaid opening with an oxygen-tolerant metal to form a first capacitor electrode electrically coupled to the second current electrode of the memory cell transistor and to form a contact plug electrically coupled to the second current electrode of the logic gate transistor;

forming a dielectric region over the first capacitor electrode; and forming a second capacitor electrode over the dielectric region.

30. The method of claim 1, wherein the step of filling includes:

simultaneously filling at least a portion of the dual inlaid opening with an oxygen-tolerant metal to form an inlaid portion having a top inlaid portion and a bottom inlaid portion.

31. The method of claim 22, wherein the step of filling includes:

filling the dual inlaid opening with the oxygen-tolerant metal to form the first capacitor electrode at the top portion of the dual inlaid opening, wherein the first capacitor electrode is formed substantially entirely within the dual inlaid opening.

32. The method of claim 22, wherein the step of forming a dielectric region includes:

forming the dielectric region in direct contact with the first capacitor electrode.

* * * * *